United States Patent
Ueyama (10) Patent No.: US 10,985,289 B2
(45) Date of Patent: Apr. 20, 2021

(54) SOLAR CELL AND SOLAR CELL MODULE

(71) Applicant: PANASONIC CORPORATION, Osaka (JP)

(72) Inventor: Tomonori Ueyama, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 16/827,494

(22) Filed: Mar. 23, 2020

(65) Prior Publication Data

US 2020/0313019 A1    Oct. 1, 2020

(30) Foreign Application Priority Data

Mar. 25, 2019   (JP) .............................. JP2019-056883

(51) Int. Cl.
| | |
|---|---|
| *H01L 31/075* | (2012.01) |
| *H01L 31/048* | (2014.01) |
| *H01L 31/0376* | (2006.01) |
| *H01L 31/20* | (2006.01) |

(52) U.S. Cl.
CPC ...... *H01L 31/075* (2013.01); *H01L 31/03762* (2013.01); *H01L 31/0488* (2013.01); *H01L 31/202* (2013.01)

(58) Field of Classification Search
CPC ............ H01L 31/075; H01L 31/03762; H01L 31/0488; H01L 31/202
See application file for complete search history.

(56) References Cited

U.S. PATENT DOCUMENTS

| | | | |
|---|---|---|---|
| 2002/0069911 A1 | 6/2002 | Nakamura et al. | |
| 2012/0305060 A1* | 12/2012 | Fu | H01L 31/054 136/255 |
| 2017/0222074 A1* | 8/2017 | Yamada | H01L 31/028 |
| 2019/0157489 A1* | 5/2019 | Matsuyama | H01L 31/022425 |

FOREIGN PATENT DOCUMENTS

| | | |
|---|---|---|
| JP | 3490964 B2 | 1/2004 |
| JP | 4159390 B2 | 10/2008 |
| JP | 2014-072416 A | 4/2014 |
| JP | 2016-219854 A | 12/2016 |
| JP | 2017-139267 A | 8/2017 |
| WO | 2018/025643 A1 | 2/2018 |
| WO | WO-2018025643 A1 * | 2/2018 ..... H01L 31/022425 |

\* cited by examiner

*Primary Examiner* — Jayne L Mershon
(74) *Attorney, Agent, or Firm* — McDermott Will and Emery LLP (57) ABSTRACT

A solar cell includes a crystalline silicon substrate, a P-doped silicon oxide layer that is formed on a principal surface of the crystalline silicon substrate and that includes phosphorus as an impurity, and an amorphous silicon layer that includes an intrinsic amorphous silicon layer and a p-type amorphous silicon layer. The intrinsic amorphous silicon layer is formed on the P-doped silicon oxide layer. The p-type amorphous silicon layer is formed on the intrinsic amorphous silicon layer and includes a p-type dopant. The intrinsic amorphous silicon layer includes the p-type dopant. The concentration of the p-type dopant in the thickness direction of the intrinsic amorphous silicon layer has a profile higher than the concentration of the p-type dopant at the interface between the P-doped silicon oxide layer and the intrinsic amorphous silicon layer.

13 Claims, 8 Drawing Sheets

SOLAR CELL AND SOLAR CELL MODULE

CROSS REFERENCE TO RELATED APPLICATION

This application claims the benefit of priority of Japanese Patent Application Number 2019-056883, filed on Mar. 25, 2019, the entire content of which is hereby incorporated by reference.

TECHNICAL FIELD

The present disclosure relates to a solar cell and a solar cell module.

BACKGROUND ART

To date, solar cells are being developed as a photoelectric conversion device that converts optical energy to electric energy. Solar cells can convert inexhaustible sunlight directly into electricity. In addition, solar cells have a smaller environmental load and are cleaner than power generation from fossil fuels. Thus, solar cells are expected to serve as a new energy source.

Japanese Unexamined Patent Application Publication No. 2016-219854 discloses a solar cell that includes an n-type crystalline semiconductor substrate and an amorphous semiconductor layer formed on a principal surface of the crystalline semiconductor substrate. The amorphous semiconductor layer has a p-type dopant density profile that decreases in the film thickness direction from the vicinity of the interface between the crystalline semiconductor substrate and the amorphous semiconductor layer and that has two inflection points between a peak portion and a bottom portion. This configuration makes it possible to improve the fill factor (FF), which in turn leads to enhanced photoelectric conversion performance.

SUMMARY

It is desired that the photoelectric conversion performance be further improved in solar cells.

Accordingly, some aspects of the present invention are directed to solving the shortcomings described above and to providing a solar cell and a solar cell module having a heterojunction structure with improved photoelectric conversion performance.

To this end, a solar cell according to one aspect of the present invention includes a crystalline silicon substrate, a phosphorus-doped layer, and an amorphous silicon layer. The phosphorus-doped layer is formed on a principal surface of the crystalline silicon substrate and includes phosphorus as an impurity. The amorphous silicon layer includes an intrinsic amorphous silicon layer and a p-type amorphous silicon layer. The intrinsic amorphous silicon layer is formed on the phosphorus-doped layer. The p-type amorphous silicon layer is formed on the intrinsic amorphous silicon layer and includes a p-type dopant. The intrinsic amorphous silicon layer includes the p-type dopant. The p-type dopant has a concentration in a thickness direction of the intrinsic amorphous silicon layer, and the concentration has a profile higher than the concentration of the p-type dopant at an interface between the phosphorus-doped layer and the intrinsic amorphous silicon layer.

A solar cell module according to one aspect of the present invention includes a plurality of the solar cells described above, a front surface protector, a back surface protector, a front surface encapsulant, and a back surface encapsulant. The plurality of solar cells are disposed two-dimensionally. The front surface protector is disposed on a front surface side of the plurality of solar cells. The back surface protector is disposed on a back surface side of the plurality of solar cells. The front surface encapsulant is disposed between the plurality of solar cells and the front surface protector. The back surface encapsulant is disposed between the plurality of solar cells and the back surface protector.

Some aspects of the present invention can provide a solar cell and a solar cell module having a heterojunction structure with improved photoelectric conversion performance.

BRIEF DESCRIPTION OF THE DRAWINGS

The figures depict one or more implementations in accordance with the present teaching, by way of examples only, not by way of limitations. In the figures, like reference numerals refer to the same or similar elements.

DETAILED DESCRIPTION

Hereinafter, embodiments of the present invention will be described in detail with reference to the drawings. The embodiments described below illustrate some specific examples of the present invention. Thus, the numerical values, the shapes, the materials, the constituent elements, the arrangement of the constituent elements, the connection modes, the steps, the orders of the steps, and so on illustrated in the following embodiments are examples and are not intended to limit the present invention. Among the constituent elements described in the following embodiments, any constituent element that is not described in an independent claim is to be construed as an optional constituent element.

The drawings are schematic diagrams and do not necessarily provide the exact depictions. In the drawings, substantially identical configurations are given identical reference characters, and duplicate descriptions thereof may be omitted or simplified.

In the present specification, a "front surface" of a solar cell refers to a surface that allows a larger amount of light to enter the solar cell therethrough than does a "back surface" opposite to the front surface (i.e., more than 50% to 100% of light enters the solar cell through the front surface). There is a case where no light enters the solar cell through its back surface. A "front surface" of a solar cell module refers to a surface that opposes a front surface of a solar cell and that allows light to enter the solar cell module therethrough. A "back surface" of a solar cell module refers to a surface opposite to the front surface. The expression "a second member is provided on a first member" or the like is not limited to a case where the first and second members are so provided as to be in direct contact with each other, unless specific limitation is indicated. In other words, the above expression includes a case where another member is present between the first and second members.

In the present specification, the terms such as "parallel" expressing the relationships between elements, the terms such as "square" expressing the shapes of elements, the numerical values, and the numerical ranges are not to be construed only in their strict sense but to be construed to include substantially equivalent ranges, such as a range with a difference of several percentage points.

In the drawings, the Z-axis direction is the direction perpendicular to a light-receiving surface of a solar cell, for example. The X-axis direction and the Y-axis direction are orthogonal to each other and are both orthogonal to the Z-axis direction. For example, in the following embodiments, "viewed in a plan view" means that the item is viewed in the Z-axis direction.

Embodiment

A solar cell and a solar cell module according to an embodiment will be described below with reference to FIGS. 1 to 9.

1. Configuration of Solar Cell Module

Figure 1:
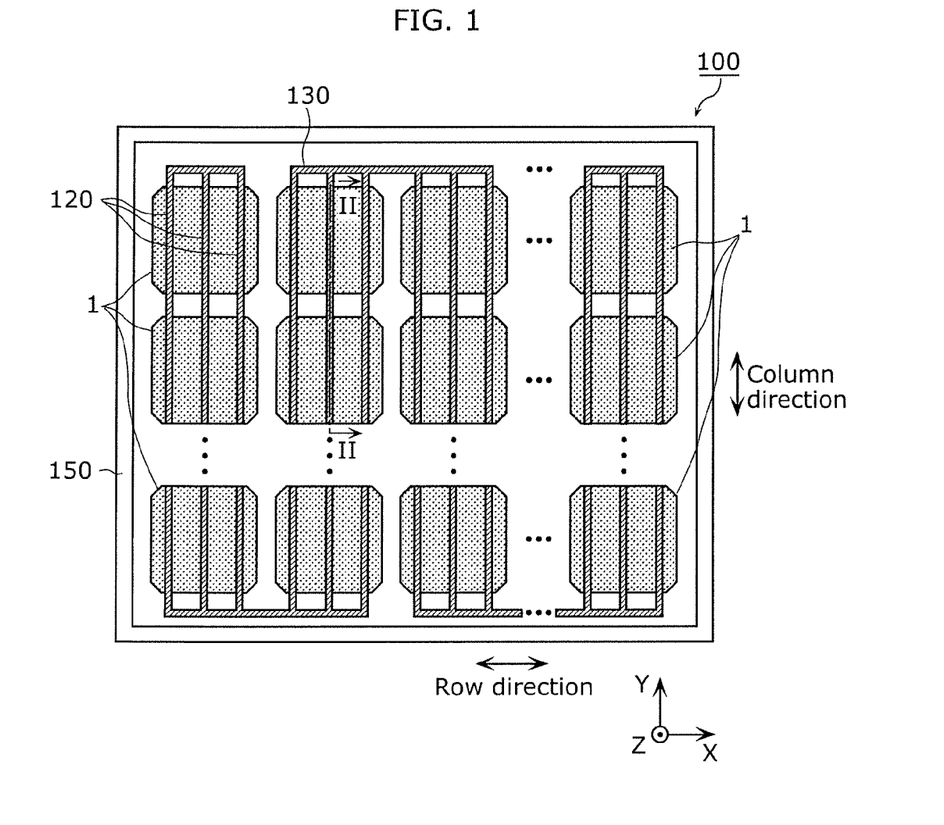
FIG. 1 is a schematic plan view of a solar cell module according to an embodiment.
Figure 2:
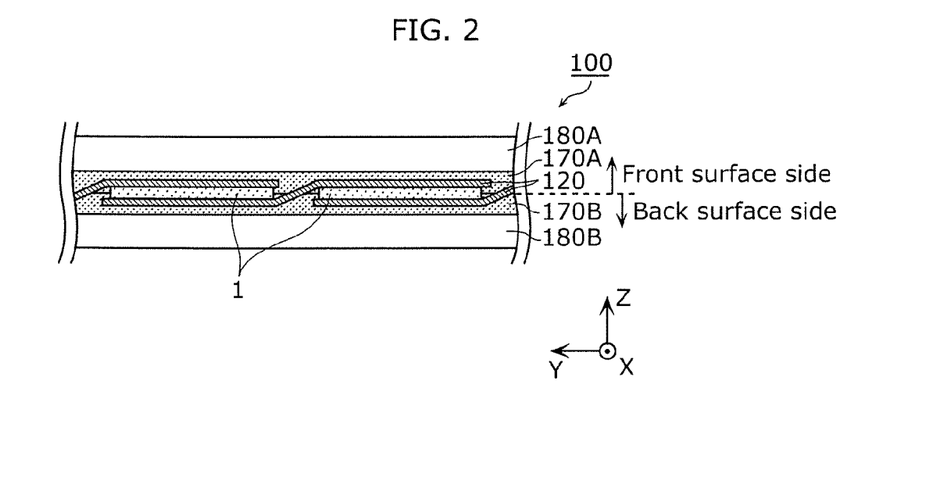
FIG. 2 is a structural sectional view taken along a column direction of a solar cell module according to an embodiment.

First, a configuration of a solar cell module will be described with reference to FIG. 1. FIG. 1 is a schematic plan view of solar cell module 100 according to the present embodiment. FIG. 2 is a structural sectional view taken along the column direction of solar cell module 100 according to the present embodiment. Specifically, FIG. 2 is a sectional view of solar cell module 100 taken along the II-II line indicated in FIG. 1.

As illustrated in FIG. 1, solar cell module 100 includes a plurality of solar cells 1, tab wires 120, interconnector wires 130, and frame member 150. As illustrated in FIG. 2, solar cell module 100 further includes front surface encapsulant 170A, back surface encapsulant 170B, front surface protector 180A, and back surface protector 180B.

Solar cells 1 are plate-like photovoltaic cells that are disposed two-dimensionally in a light-receiving surface and that generate electric power upon receiving light irradiation.

Tab wire 120 is a wire member that electrically connects solar cells 1 adjacent in the column direction. Tab wire 120 is a ribbon-like metal foil, for example. Tab wire 120 can be fabricated, for example, by cutting a metal foil, such as a copper foil or a silver foil, having its entire surface covered by solder, silver, or the like into a rectangular piece having a predetermined length.

Interconnector wire 130 is a wire member that connects solar cell strings. A solar cell string is a set of solar cells 1 arrayed in the column direction and connected by tab wires 120.

Frame member 150 is an outer frame member that encloses an outer peripheral portion of a panel in which the plurality of solar cells 1 are arrayed two-dimensionally.

A light-diffusing member may be disposed between adjacent solar cells 1. This makes it possible to redirect light incident on a gap region between solar cells 1 toward solar cells 1, and this leads to improved efficiency in collecting light onto solar cells 1. Accordingly, the photoelectric conversion efficiency of solar cell module 100 as a whole can be improved.

As illustrated in FIG. 2, in two solar cells 1 adjacent in the column direction, tab wire 120 disposed on the front surface of one solar cell 1 is also disposed on the back surface of other solar cell 1. To be more specific, the lower surface of one end portion of tab wire 120 is bonded to a busbar electrode on the front surface side of one solar cell 1, and the upper surface of the other end portion of tab wire 120 is bonded to a busbar electrode on the back surface side of other solar cell 1.

Tab wire 120 is bonded to the busbar electrodes with a conductive adhesive, for example. For the conductive adhesive, a conductive adhesive paste, a conductive adhesive film, or an anisotropic conductive film can be used, for example. A conductive adhesive paste is a paste-type adhesive in which conductive particles are dispersed in a thermosetting adhesive resin material, such as an epoxy resin, an acrylic resin, or a urethane resin, for example. A conductive adhesive film and an anisotropic conductive film are each formed by dispersing conductive particles in a thermosetting adhesive resin material and forming this into a film.

The conductive adhesive described above may be a solder material. In place of the conductive adhesive, a resin adhesive that includes no conductive particle may be used. In this case, designing the coating thickness of the resin adhesive appropriately allows the resin adhesive to soften when pressure is applied thereto in thermocompression bonding, and the busbar electrodes and tab wire 120 can be brought into direct contact and electrically connected to each other.

As illustrated in FIG. 2, front surface protector 180A is disposed on the front surface side of solar cells 1, and back surface protector 180B is disposed on the back surface side. Front surface encapsulant 170A is disposed between the plane including solar cells 1 and front surface protector 180A, and back surface encapsulant 170B is disposed between the plane including solar cells 1 and back surface protector 180B. Front surface protector 180A and back surface protector 180B are secured by front surface encapsulant 170A and back surface encapsulant 170B, respectively.

Front surface protector 180A is a light-transmissive substrate that protects the front surface side of solar cell module 100. Front surface protector 180A protects the inside (solar cells 1 and so on) of solar cell module 100 from an outer environment, such as, wind, rain, external impact, or fire. Front surface protector 180A is a light-transmissive member having a light-transmissive property. Front surface protector 180A is, for example, a glass substrate (transparent glass substrate) made of a transparent glass material or a film-like or plate-like resin substrate made of a hard resin material having a light-transmissive property and a water-impermeable property.

Back surface protector 180B is a member that protects the back surface of solar cell module 100 from an outer environment. For example, a resin film of polyethylene terephthalate (PET) or the like, a layered film having a structure in which an Al foil is sandwiched by resin films, or the like can be used for back surface protector 180B.

Front surface encapsulant 170A and back surface encapsulant 170B have a sealing function for blocking solar cell 1 from an outer environment. The presence of front surface encapsulant 170A and back surface encapsulant 170B makes it possible to ensure the high heat-resistant property and the high moisture-resistant property of solar cell module 100 that is presumably installed outdoor.

Front surface encapsulant 170A and back surface encapsulant 170B are each made of a light-transmissive polymer material having a sealing function. Examples of the polymer material for front surface encapsulant 170A include a light-transmissive resin material, such as ethylene vinyl acetate (EVA).

Front surface encapsulant 170A and back surface encapsulant 170B may be made of the same type of material, from the viewpoint of simplifying the manufacturing process and ensuring the adhesiveness at the interface between front surface encapsulant 170A and back surface encapsulant 170B.

2. Configuration of Solar Cell

Figure 3:
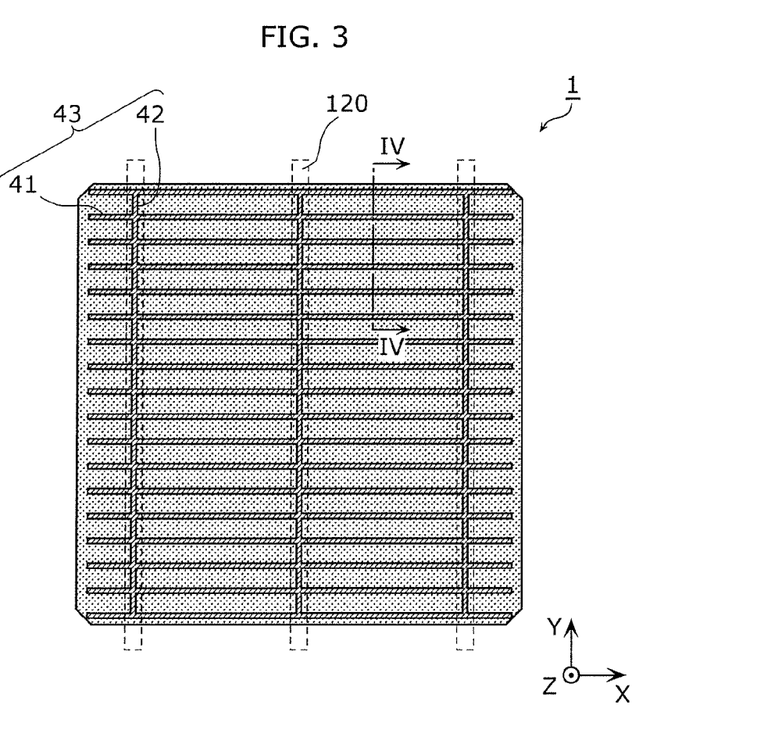
FIG. 3 is a plan view of a solar cell according to an embodiment.
Figure 4:
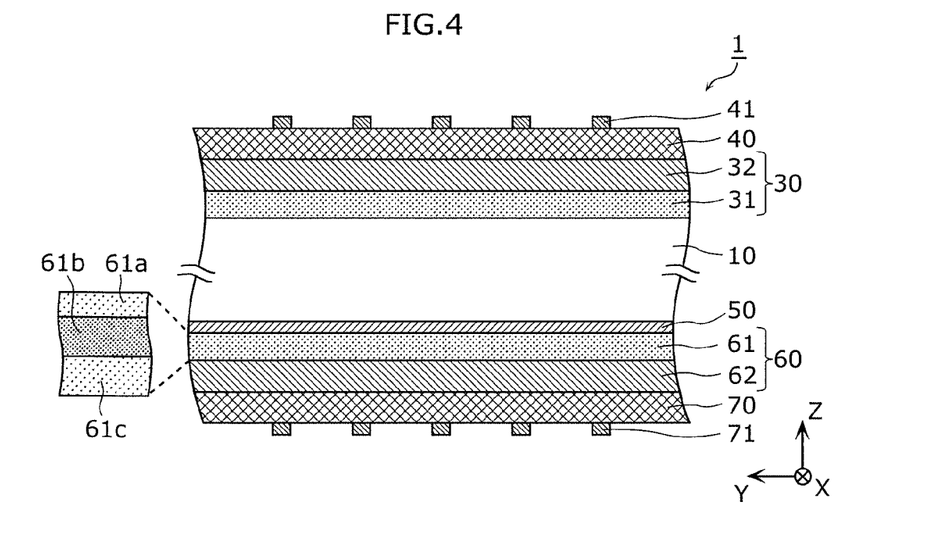
FIG. 4 is a schematic sectional view illustrating a layer structure of a solar cell according to an embodiment.
Figure 5:
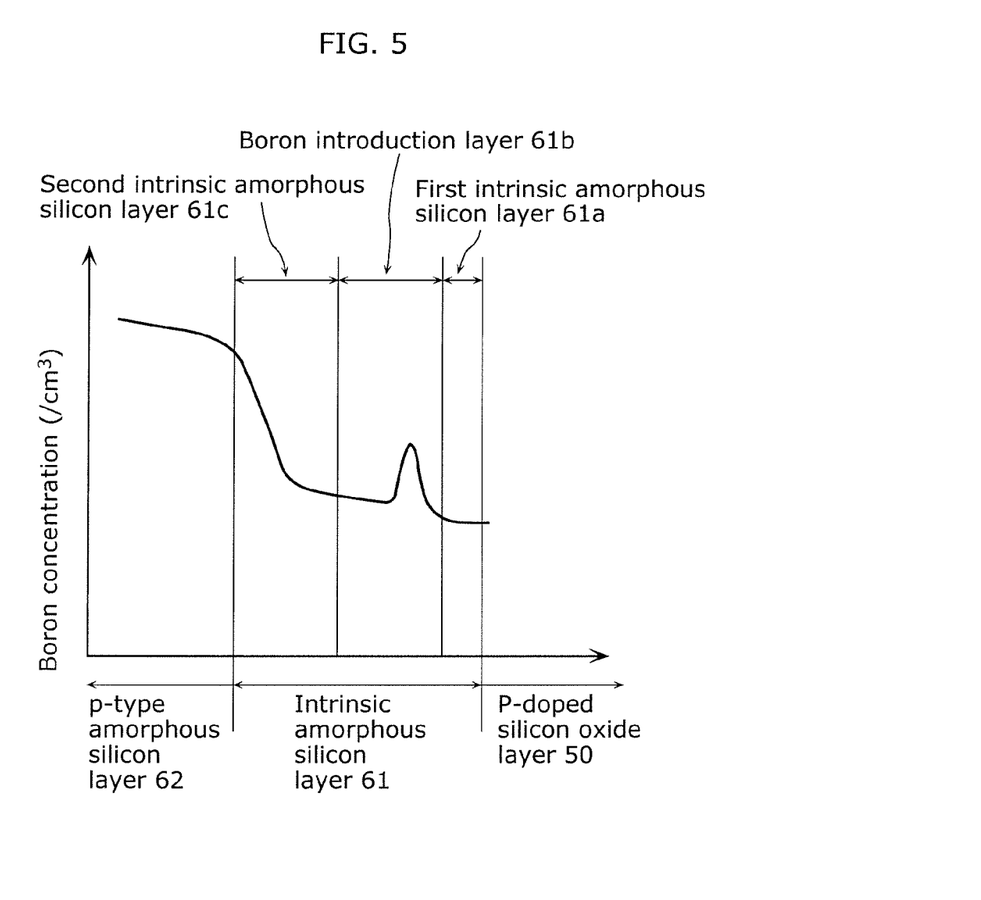
FIG. 5 is a graph illustrating an example of a boron concentration profile with respect to the thickness direction of an intrinsic amorphous silicon layer.

With reference to FIGS. 3 to 5, solar cell 1, which is a primary constituent element of solar cell module 100, will be described. FIG. 3 is a plan view of solar cell 1 according to the present embodiment. FIG. 4 is a schematic sectional view illustrating the layer structure of solar cell 1 according to the present embodiment. FIG. 4 is a sectional view of solar cell 1 taken along the IV-IV line indicated in FIG. 3.

As illustrated in FIG. 3, solar cell 1 has a square shape as viewed in a plan view. The dimensions of solar cell 1 are 125 mm in length by 125 mm in width by 200 μm in thickness, for example. On the front surface of solar cell 1, a stripe-pattern plurality of busbar electrodes 42 are formed parallel to each other, and a stripe-pattern plurality of finger electrodes 41 are formed parallel to each other and orthogonal to busbar electrodes 42. Busbar electrodes 42 and finger electrodes 41 constitute collector electrode 43. Collector electrode 43 is formed by a conductive paste that includes conductive particles of silver (Ag) or the like, for example. Busbar electrode 42 has a linewidth of 1.5 mm, for example. Finger electrode 41 has a linewidth of 100 μm, for example. The pitch of finger electrodes 41 is 2 mm, for example. Tab wire 120 is bonded on busbar electrode 42.

As illustrated in FIG. 4, the basic structure of solar cell 1 is a semiconductor p-n junction. Solar cell 1 includes silicon substrate 10, P-doped silicon oxide layer 50, amorphous silicon layers 30 and 60, transparent electrodes 40 and 70, and finger electrodes 41 and 71. FIG. 4 illustrates only finger electrodes 41 of collector electrode 43.

Silicon substrate 10 is a crystalline silicon substrate having a first principal surface and a second principal surface that are opposite to each other. In the present embodiment, silicon substrate 10 is an n-type monocrystalline silicon substrate. Silicon substrate 10 may instead be made of polycrystalline silicon. The first principal surface and the second principal surface may each have a textured structure in which a plurality of pyramids are disposed two-dimensionally. P-doped silicon oxide layer 50 is disposed on the second principal surface of silicon substrate 10.

Amorphous silicon layer 30 is a first amorphous silicon layer that is disposed on the first principal surface of silicon substrate 10 and that is in a substantially amorphous state. Amorphous silicon layer 30 includes intrinsic amorphous silicon layer 31 and n-type amorphous silicon layer 32.

Intrinsic amorphous silicon layer 31 is formed on the first principal surface of silicon substrate 10. Intrinsic amorphous silicon layer 31 includes hydrogen and is in an amorphous state, for example. Herein, an intrinsic amorphous silicon layer is an amorphous semiconductor layer that contains a p-type or n-type dopant at a concentration lower than the concentration of a p-type or n-type dopant included in n-type amorphous silicon layer 32 or p-type amorphous silicon layer 62. An intrinsic amorphous silicon layer is an amorphous semiconductor layer that contains a p-type or n-type dopant at a mean concentration of no higher than $5 \times 10^{18}$/cm$^3$, for example. Alternatively, when an intrinsic amorphous silicon layer includes both p-type and n-type dopants, an intrinsic amorphous silicon layer is an amorphous semiconductor layer that contains the p-type and n-type dopants at a combined concentration of no higher than $5 \times 10^{18}$/cm$^3$, for example. Intrinsic amorphous silicon layer 31 may be thin enough to suppress absorption of light as much as possible and also thick enough to allow the front surface of silicon substrate 10 to be passivated sufficiently. The film thickness of intrinsic amorphous silicon layer 31 is, for example, no less than 1 nm nor more than 25 nm or preferably no less than 5 nm nor more than 10 nm.

N-type amorphous silicon layer 32 is a first conductivity-type amorphous silicon layer that is formed on intrinsic amorphous silicon layer 31, that includes an n-type dopant of the same conductivity type as silicon substrate 10, and that is in a substantially amorphous state. N-type amorphous silicon layer 32 is formed by an amorphous silicon semiconductor thin film that includes hydrogen, for example. N-type amorphous silicon layer 32 has a higher in-film concentration of the n-type dopant than intrinsic amorphous silicon layer 31. The concentration of the n-type dopant is preferably no less than $1 \times 10^{20}$/cm$^3$. The n-type dopant is phosphorus (P), for example.

N-type amorphous silicon layer 32 may be thin enough to suppress absorption of light as much as possible. N-type amorphous silicon layer 32 may also be thick enough to allow carriers generated in silicon substrate 10 to be separated effectively and to allow the generated carriers to be collected efficiently by transparent electrode 40. The film thickness of n-type amorphous silicon layer 32 is no less than 2 nm nor more than 50 nm, for example. In the present embodiment, the film thickness of n-type amorphous silicon layer 32 is 10 nm. N-type amorphous silicon layer 32 may be configured such that the concentration of the n-type dopant varies stepwise from the side of intrinsic amorphous silicon layer 31 toward the side of transparent electrode 40.

P-doped silicon oxide layer 50 is a silicon layer that is formed on the second principal surface of silicon substrate 10 and that includes phosphorus as an impurity. P-doped silicon oxide layer 50 is, for example, a silicon oxide layer disposed on the second principal surface of silicon substrate 10 and is formed by a silicon oxide film that includes phosphorus as an impurity. P-doped silicon oxide layer 50 is, for example, a region doped to the same conductivity type as silicon substrate 10. P-doped silicon oxide layer 50 has a thickness of no more than 1 μm and has a thickness of, for example, 200 nm. P-doped silicon oxide layer 50 may be formed as islands at the interface between silicon substrate 10 and amorphous silicon layer 60. P-doped silicon oxide layer 50 is an example of a phosphorus-doped layer. It is not limited that P-doped silicon oxide layer 50 includes phosphorus, and it suffices that P-doped silicon oxide layer 50 be an n-type conductive impurity-doped layer doped with an n-type conductive impurity.

The phosphorus concentration (phosphorus atomic concentration) in P-doped silicon oxide layer 50 is higher than the phosphorus concentration in silicon substrate 10. The phosphorus concentration in P-doped silicon oxide layer 50 is, for example, no less than $1\times10^{17}/cm^3$ nor more than $1\times10^{20}/cm^3$ or more preferably no less than $1\times10^{18}/cm^3$ nor more than $1\times10^{19}/cm^3$. P-doped silicon oxide layer 50 also includes oxygen. The oxygen concentration (oxygen atomic concentration) is, for example, no less than $1\times10^{20}/cm^3$ nor more than $1\times10^{22}/cm^3$ or more preferably no less than $1\times10^{20}/cm^3$ nor more than $1\times10^{21}/cm^3$. P-doped silicon oxide layer 50 may be an amorphous layer. The use of an amorphous layer as P-doped silicon oxide layer 50 makes it possible to form P-doped silicon oxide layer 50 at a low temperature of no higher than 200° C., for example. P-doped silicon oxide layer 50 may be formed on a principal surface of silicon substrate 10 where no textured structure is present. This makes it possible to achieve a phosphorus concentration higher by several folds than the phosphorus concentration obtained when P-doped silicon oxide layer 50 is formed on a principal surface with a textured structure.

To improve an open-circuit voltage (VOC), aside from suppressing recombination of carriers by impurity doping, ensuring a high degree of amorphousness of amorphous silicon layer 60 is important. From this viewpoint, interposing a silicon oxide film layer between amorphous silicon layer 60 and silicon substrate 10 makes it possible to suppress epitaxial growth reflecting the crystallinity of silicon substrate 10 in amorphous silicon layer 60. Since P-doped silicon oxide layer 50 is interposed, instead of interposing an impurity at the junction interface, an increase in a defect in the front surface of silicon substrate 10 can be suppressed. In other words, the passivation performance improves. This makes it possible to improve the open-circuit voltage. Furthermore, the presence of P-doped silicon oxide layer 50 makes it possible to reduce a breakdown voltage and to suppress a decrease in the photoelectric conversion performance, which could occur when a shadow is cast over solar cell 1.

Amorphous silicon layer 60 is a second amorphous silicon layer that is disposed on the second principal surface of silicon substrate 10 and that is in a substantially amorphous state. Amorphous silicon layer 60 includes intrinsic amorphous silicon layer 61 formed on P-doped silicon oxide layer 50 and p-type amorphous silicon layer 62 that is formed on intrinsic amorphous silicon layer 61 and that includes a p-type dopant.

Intrinsic amorphous silicon layer 61 is formed on the second principal surface of silicon substrate 10. Intrinsic amorphous silicon layer 61 includes hydrogen and is in an amorphous state, for example. As with the film thickness of intrinsic amorphous silicon layer 31, the film thickness of intrinsic amorphous silicon layer 61 is, for example, no less than 1 nm nor more than 25 nm or preferably no less than 5 nm nor more than 10 nm. In the present embodiment, the film thickness of intrinsic amorphous silicon layer 61 is 10 nm.

Intrinsic amorphous silicon layer 61 has a layered structure of first intrinsic amorphous silicon layer 61a, boron introduction layer 61b, and second intrinsic amorphous silicon layer 61c. First intrinsic amorphous silicon layer 61a is laminated and formed on the front surface of P-doped silicon oxide layer 50. P-type amorphous silicon layer 62 is laminated and formed on the front surface of second intrinsic amorphous silicon layer 61c. Boron introduction layer 61b is sandwiched and disposed between first intrinsic amorphous silicon layer 61a and second intrinsic amorphous silicon layer 61c.

First intrinsic amorphous silicon layer 61a and second intrinsic amorphous silicon layer 61c are each an intrinsic amorphous semiconductor layer formed without being doped with boron (B). Boron introduction layer 61b is an amorphous semiconductor layer formed with being doped with boron. In this manner, intrinsic amorphous silicon layer 61 includes boron. That intrinsic amorphous silicon layer 61 includes boron means that intrinsic amorphous silicon layer 61 is so fabricated as to intentionally include boron. Boron is an example of a p-type dopant, but the p-type dopant is not limited to boron.

When intrinsic amorphous silicon layer 61 has a film thickness of 10 nm, for example, first intrinsic amorphous silicon layer 61a has a film thickness of 2 nm, boron introduction layer 61b has a film thickness of 4 nm, and second intrinsic amorphous silicon layer 61c has a film thickness of 4 nm.

P-type amorphous silicon layer 62 is a second conductivity-type amorphous silicon layer that is formed on intrinsic amorphous silicon layer 61, that includes a p-type dopant of the opposite conductivity type to silicon substrate 10, and that is in a substantially amorphous state. P-type amorphous silicon layer 62 is formed by an amorphous silicon semiconductor thin film that includes hydrogen, for example. P-type amorphous silicon layer 62 has a higher in-film concentration of the p-type dopant than intrinsic amorphous silicon layer 61, and the concentration of the p-type dopant is preferably no less than $1\times10^{20}/cm^3$. The p-type dopant is boron (B), for example. P-type amorphous silicon layer 62 may be thin enough to suppress absorption of light as much as possible. P-type amorphous silicon layer 62 may also be thick enough to allow carriers generated in silicon substrate 10 to be separated effectively and to allow the generated carriers to be collected efficiently by transparent electrode 70. P-type amorphous silicon layer 62 may be configured such that the concentration of the p-type dopant varies stepwise from the side of silicon substrate 10 toward the side of transparent electrode 70.

Intrinsic amorphous silicon layer 31, intrinsic amorphous silicon layer 61, n-type amorphous silicon layer 32, and p-type amorphous silicon layer 62 may each include crystallites.

Transparent electrode 40 is formed on the front surface of amorphous silicon layer 30 and collects carriers in n-type amorphous silicon layer 32. Transparent electrode 70 is formed on the back surface of amorphous silicon layer 60 and collects carriers in p-type amorphous silicon layer 62. Transparent electrodes 40 and 70 are each a transparent conductive film (TCO film) formed of a transparent conductive material. Transparent electrodes 40 and 70 are each formed of, for example but not limited to, a transparent conductive oxide, such as indium tin oxide (ITO). Transparent electrodes 40 and 70 may each include at least one metal oxide having a polycrystalline structure, such as indium oxide ($In_2O_3$), zinc oxide (ZnO), tin oxide ($SnO_2$), or titanium oxide ($TiO_2$). These metal oxides may be doped with a dopant, such as tin (Sn), zinc (Zn), tungsten (W), antimony (Sb), titanium (Ti), aluminum (Al), cerium (Ce), or gallium (Ga). For example, ITO in which $In_2O_3$ is doped with Sn may be used. The concentration of the dopant can be 0 to 20 mass %.

Whether the first principal surface of silicon substrate 10 serves as a light-receiving surface (a surface through which light is introduced mainly from the outside) or the second principal surface serves as a light-receiving surface can be decided as desired.

Although the conductivity type of silicon substrate 10 is n-type in the present embodiment, the conductivity type may instead be p-type. In this case, p-type amorphous silicon layer 62 of amorphous silicon layer 60 has the same conductivity type as silicon substrate 10, and thus amorphous silicon layer 60 serves as a first amorphous silicon layer. In addition, n-type amorphous silicon layer 32 of amorphous silicon layer 30 has the conductivity type opposite to the conductivity type of silicon substrate 10, and thus amorphous silicon layer 30 serves as a second amorphous silicon layer.

Although solar cell 1 according to the present embodiment is a solar cell of a double-sided light-receiving type in which transparent electrode 70 is disposed on the second principal surface as well, solar cell 1 may instead be of a single-sided light-receiving type in which transparent electrode 70 is replaced by a metal electrode that is not transparent. Furthermore, solar cell 1 may be a solar cell of a back-junction type in which both an n-type amorphous silicon layer and a p-type amorphous silicon layer are formed on the back surface opposite to the light-receiving surface of silicon substrate 10 where light is incident.

FIG. 5 is a graph illustrating an example of a boron concentration profile with respect to the thickness direction of intrinsic amorphous silicon layer 61. In the graph illustrated in FIG. 5, the concentration of boron is measured in the direction from p-type amorphous silicon layer 62 toward P-doped silicon oxide layer 50 through a secondary ion mass spectroscopy (SIMS) analysis, for example. The orientation from P-doped silicon oxide layer 50 toward p-type amorphous silicon layer 62 is referred to as a first orientation.

As illustrated in FIG. 5, the boron concentration (boron atomic concentration) in the thickness direction of intrinsic amorphous silicon layer 61 has a profile higher than the boron concentration at the interface between P-doped silicon oxide layer 50 and intrinsic amorphous silicon layer 61 (specifically, first intrinsic amorphous silicon layer 61a). In other words, the boron concentration in intrinsic amorphous silicon layer 61 has a distribution higher than the boron concentration at the interface at least at a portion of intrinsic amorphous silicon layer 61 in the thickness direction. It can also be said that intrinsic amorphous silicon layer 61 has a region where its boron concentration is higher than the boron concentration at the interface. For example, the boron concentration in the thickness direction of intrinsic amorphous silicon layer 61 has a distribution that increases relative to the boron concentration at the interface between P-doped silicon oxide layer 50 and intrinsic amorphous silicon layer 61. Specifically, at least boron introduction layer 61b among first intrinsic amorphous silicon layer 61a, boron introduction layer 61b, and second intrinsic amorphous silicon layer 61c has a distribution in which the boron concentration increases in a region where the concentration is higher than the boron concentration at the interface, with the boron concentration at the interface serving as a reference. The thickness direction of intrinsic amorphous silicon layer 61 is the direction from the stated interface toward p-type amorphous silicon layer 62 and is the direction parallel to the Z-axis in the drawings.

In the present embodiment, a local maximum of the boron concentration is present in the thickness direction. Specifically, a local maximum of the boron concentration is present in boron introduction layer 61b. The boron concentration at this local maximum is, for example, no less than $1 \times 10^{17}/cm^3$ nor more than $1 \times 10^{20}/cm^3$. As the boron concentration is no less than $1 \times 10^{17}/cm^3$, the series resistance component caused by intrinsic amorphous silicon layer 61 can be reduced. In other words, a high fill factor (FF) can be obtained. Furthermore, as the boron concentration is no more than $1 \times 10^{20}/cm^3$, a decrease in the passivation performance at the junction portion of P-doped silicon oxide layer 50 and p-type amorphous silicon layer 62 can be suppressed. In other words, a high open-circuit voltage (VOC) can be obtained. Accordingly, as the boron concentration at the local maximum is no less than $1 \times 10^{17}/cm^3$ nor more than $1 \times 10^{20}/cm^3$, a high fill factor and a high open-circuit voltage can both be achieved, and this makes it possible to improve the photoelectric conversion efficiency of solar cell 1. When the boron concentration at the local maximum is no less than $1 \times 10^{18}/cm^3$ nor more than $1 \times 10^{19}/cm^3$, the photoelectric conversion efficiency of solar cell 1 can be further improved.

The boron concentration at the interface between P-doped silicon oxide layer 50 and first intrinsic amorphous silicon layer 61a is lower than the boron concentration at the local maximum. The boron concentration at the interface may be lower than the boron concentration in boron introduction layer 61b. Furthermore, the boron concentration at the interface may be lower than the boron concentration in at least one of first intrinsic amorphous silicon layer 61a or second intrinsic amorphous silicon layer 61c. The boron concentration at the interface between P-doped silicon oxide layer 50 and first intrinsic amorphous silicon layer 61a is lower than $1 \times 10^{17}/cm^3$, for example. Thus, the reduced boron concentration at the interface leads to improved passivation performance, and this makes it possible to reduce the carrier loss at the interface. For example, when oxygen is present at the interface, this oxygen and boron form a composite defect, and a decrease in the carrier lifetime can be suppressed.

The boron concentration profile has a local maximum within a range of no less than 2 nm nor more than 10 nm in the first orientation from the interface between P-doped silicon oxide layer 50 and first intrinsic amorphous silicon layer 61a. More preferably, the boron concentration profile has a local maximum within a range of no less than 2 nm nor more than 6 nm in the first orientation from the interface between P-doped silicon oxide layer 50 and first intrinsic amorphous silicon layer 61a.

Furthermore, the boron concentration profile may have a local maximum within a range of no less than 20% nor more than 50% of the thickness of amorphous silicon layer 60 in the first orientation from the interface between P-doped silicon oxide layer 50 and first intrinsic amorphous silicon layer 61a. It suffices that the boron concentration in intrinsic amorphous silicon layer 61 have a profile in which the concentration increases with respect to the boron concentration at the interface.

Neither of the boron concentration profiles in first intrinsic amorphous silicon layer 61a and second intrinsic amorphous silicon layer 61c has a local maximum of the boron concentration.

Although not illustrated, the oxygen concentration reaches a local maximum in the vicinity of the interface between P-doped silicon oxide layer 50 and first intrinsic amorphous silicon layer 61a, for example. In other words, the oxygen concentration has a local maximum in the vicinity of the interface between P-doped silicon oxide layer 50 and first intrinsic amorphous silicon layer 61a. Solar cell 1 according to the present embodiment has a local maximum of the oxygen concentration and a local maximum of the boron concentration in the thickness direction, but the position where the local maximum of the oxygen concentration is present and the position where the local maximum of the boron concentration is present do not coincide with each other. The local maximum of the boron concentration is present closer to p-type amorphous silicon layer 62 (first orientation side) than the local maximum of the oxygen concentration. The gap between the local maximum of the boron concentration and the local maximum of the oxygen concentration is no less than 2 nm, for example. The boron concentration profile and the oxygen concentration profile may intersect with each other. For example, in the concentration profiles, the curve where the boron concentration increases may intersect with the curve where the oxygen concentration decreases.

3. Method of Manufacturing Solar Cell

Figure 6:
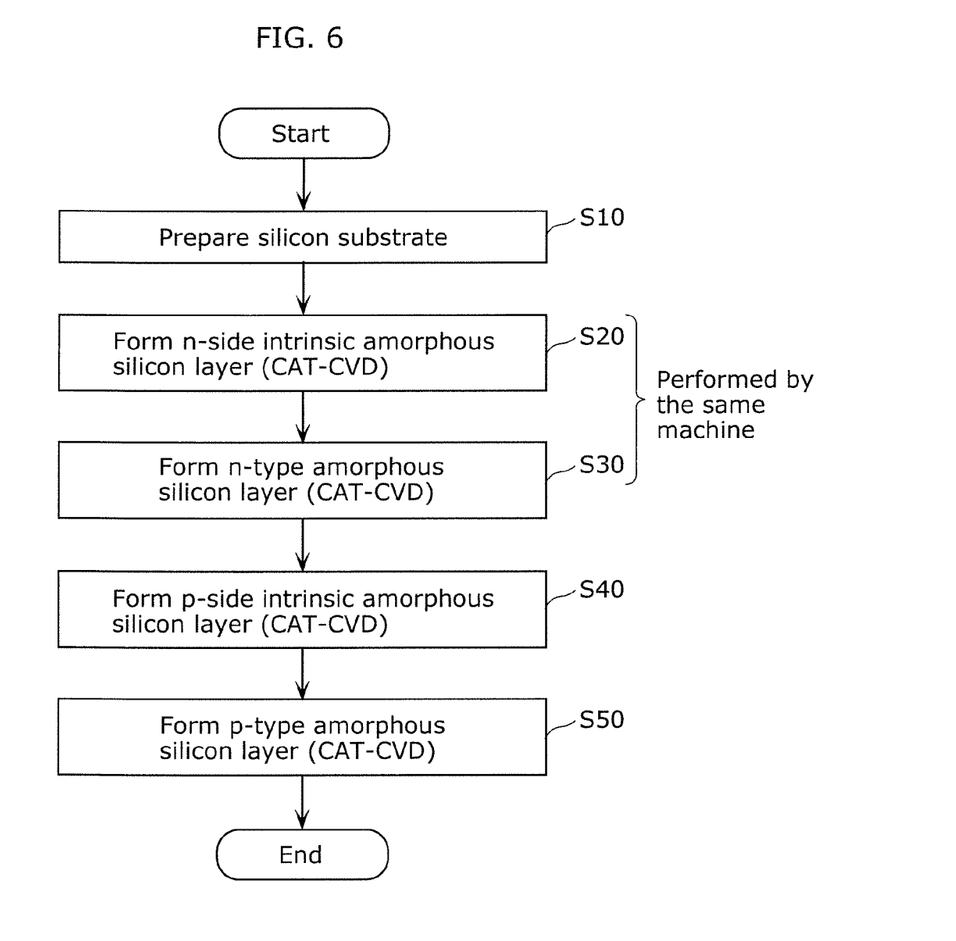
FIG. 6 is a flowchart illustrating an example of a method of manufacturing a solar cell according to an embodiment.
Figure 7:
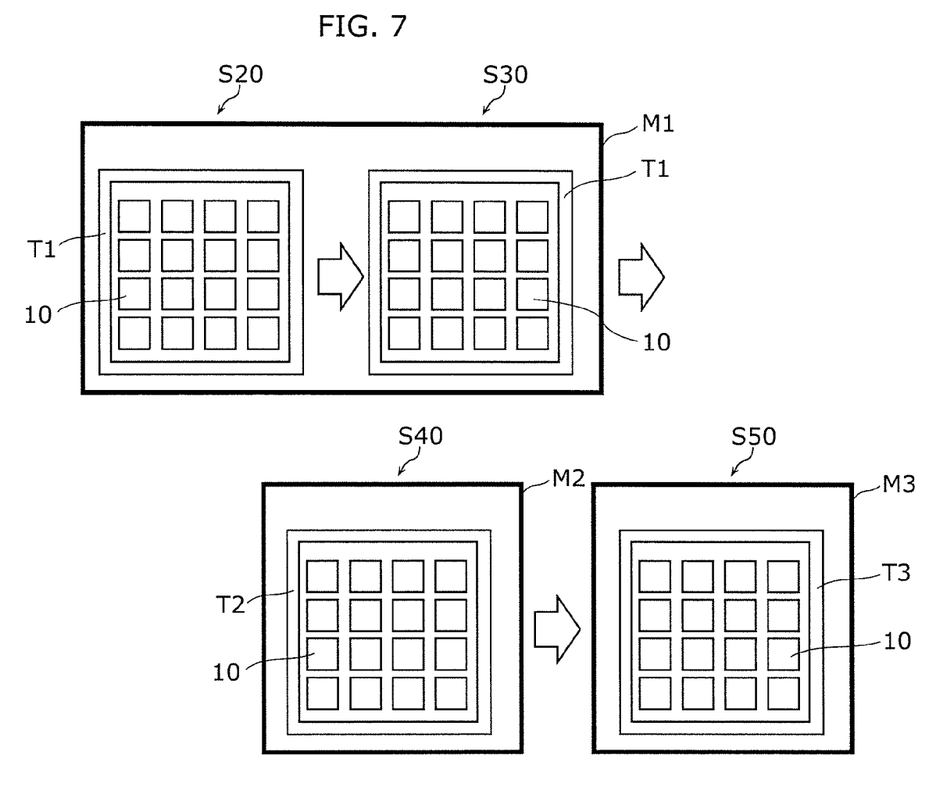
FIG. 7 is a schematic diagram for describing an example of a method of manufacturing a solar cell according to an embodiment.

Next, with reference to FIGS. 6 to 9, a method of manufacturing solar cell 1 described above will be described. First, with reference to FIGS. 6 and 7, an example of the method of manufacturing solar cell 1 described above will be described. FIG. 6 is a flowchart illustrating an example of the method of manufacturing solar cell 1 according to the present embodiment. FIG. 7 is a schematic diagram for describing the example of the method of manufacturing solar cell 1 according to the present embodiment. In the example described with reference to FIG. 6, each amorphous silicon layer is formed through catalytic chemical vapor deposition (CAT-CVD) from the viewpoint of productivity, but this is not a limiting example.

In CAT-CVD, a material gas in introduced into a thin-film deposition chamber in which a wire (catalyst member) formed of tungsten or the like is disposed, the material gas is subjected to a catalytic cracking reaction with the wire electrically heated by a power source, and the generated reaction product (cracked product) is deposited on a target (e.g., silicon substrate 10).

As illustrated in FIG. 6, first, silicon substrate 10 is prepared (S10). Presumably, P-doped silicon oxide layer 50 is formed on silicon substrate 10. P-doped silicon oxide layer 50 is formed by introducing, into a thin-film deposition chamber (vacuum chamber) of a thin-film deposition machine, a silicon-containing gas, such as silane ($SiH_4$), an n-type dopant-containing gas, such as phosphine ($PH_3$), and an oxygen-containing gas, such as $O_2$, $H_2O$, or $CO_2$, for example. P-doped silicon oxide layer 50 is formed in a state in which a plurality of silicon substrates 10 are disposed in a tray for depositing P-doped silicon oxide layer 50.

Before P-doped silicon oxide layer 50 is formed, silicon substrate 10 may be washed, placed in a vacuum chamber, and heated to no higher than 200° C. Thus, P-doped silicon oxide layer 50 may be formed after moisture on the front surface of silicon substrate 10 has been removed as much as possible. Next, a hydrogen gas may be introduced to clean the front surface of the substrate through hydrogen radical processing. This process (hydrogen processing) is effective in reducing the amount of carbon on the front surface of the substrate.

Then, an n-side intrinsic amorphous silicon layer (intrinsic amorphous silicon layer 31) and n-type amorphous silicon layer 32 are formed on the first principal surface of silicon substrate 10 where no P-doped silicon oxide layer 50 is formed (S20 and S30). On silicon substrate 10, n-type amorphous silicon layer 32 is formed successively after intrinsic amorphous silicon layer 31 has been formed. In other words, steps S20 and S30 are performed successively in the same thin-film deposition machine. As illustrated in FIG. 7, in the present embodiment, steps S20 and S30 are performed with the use of single tray T1 and single thin-film deposition machine M1. In tray T1, silicon substrate 10 is disposed with the first principal surface being exposed.

In step S20, a gas obtained by diluting a silicon-containing gas, such as silane ($SiH_4$), with hydrogen is supplied as a material gas into the thin-film deposition chamber, and this gas is cracked at the surface of the wire that is disposed in the thin-film deposition chamber and heated through electricity. This cracked gas is supplied onto the first principal surface of heated silicon substrate 10, and thus intrinsic amorphous silicon layer 31 is formed.

In step S30, a mixed gas obtained by diluting a silicon-containing gas, such as silane ($SiH_4$), and an n-type dopant-containing gas, such as phosphine ($PH_3$), with hydrogen is supplied as a material gas into the thin-film deposition chamber, and this gas is cracked at the surface of the wire that is disposed in the thin-film deposition chamber and heated through electricity. This cracked gas is supplied to intrinsic amorphous silicon layer 31 on heated silicon substrate 10, and thus n-type amorphous silicon layer 32 is formed.

After amorphous silicon layer 30 is formed on silicon substrate 10 by thin-film deposition machine M1, silicon substrate 10 is removed from thin-film deposition machine M1, the tray for thin-film deposition is switched from tray T1 to tray T2, and then step S40 is performed. When silicon substrate 10 is moved from tray T1 to tray T2, silicon substrate 10 is disposed in tray T2 so that the second principal surface of silicon substrate 10 is exposed. In other words, silicon substrate 10 is flipped and disposed in tray T2.

Referring back to FIG. 6, next, a p-side intrinsic amorphous silicon layer (intrinsic amorphous silicon layer 61) and p-type amorphous silicon layer 62 are formed on the second principal surface of silicon substrate 10 where P-doped silicon oxide layer 50 is formed (S40 and S50). Steps S40 and S50 are performed in separate thin-film deposition machines. As illustrated in FIG. 7, in the present embodiment, steps S40 and S50 are performed with the use of different trays T2 and T3 and different thin-film deposition machines M2 and M3. Specifically, after intrinsic amorphous silicon layer 61 is formed on silicon substrate 10 by thin-film deposition machine M2, silicon substrate 10 is removed from thin-film deposition machine M2, the tray for thin-film deposition is switched from tray T2 to tray T3, and then p-type amorphous silicon layer 62 is deposited with the use of thin-film deposition machine M3 different from thin-film deposition machines M1 and M2.

In step S40, a mixed gas obtained by diluting a silicon-containing gas, such as silane ($SiH_4$), and a p-type dopant-containing gas, such as diborane ($B_2H_6$), with hydrogen is supplied as a material gas into the thin-film deposition chamber, and this gas is cracked at the surface of the wire that is disposed in the thin-film deposition chamber and heated through electricity. This cracked gas is supplied onto the second principal surface of heated silicon substrate 10 (onto P-doped silicon oxide layer 50), and thus intrinsic amorphous silicon layer 61 is formed. In step S40, a mixed gas obtained by diluting a p-type dopant-containing gas, such as diborane ($B_2H_6$), with hydrogen is supplied intentionally.

In step S40, intrinsic amorphous silicon layer 61 including first intrinsic amorphous silicon layer 61a, boron introduction layer 61b, and second intrinsic amorphous silicon layer 61c is formed. Therefore, diborane ($B_2H_6$) is supplied only for a prescribed period in step S40. Specifically, step S40 includes a first step for forming first intrinsic amorphous silicon layer 61a, a second step for forming boron introduction layer 61b, and a third step for forming second intrinsic amorphous silicon layer 61c. The prescribed period is a period in which the second step for forming boron introduction layer 61b is performed, for example.

In the first step, a gas obtained by diluting a silicon-containing gas, such as silane ($SiH_4$), with hydrogen is supplied as a material gas into the thin-film deposition chamber. Thus, first intrinsic amorphous silicon layer 61a is formed on the second principal surface of silicon substrate 10.

In the second step, a mixed gas obtained by diluting a silicon-containing gas, such as silane ($SiH_4$), and a p-type dopant-containing gas that includes a small amount of p-type dopant, such as diborane ($B_2H_6$), with hydrogen is supplied as a material gas into the thin-film deposition chamber, and this gas is cracked at the surface of the wire that is disposed in the thin-film deposition chamber and heated through electricity. This cracked gas is supplied onto first intrinsic amorphous silicon layer 61a on heated silicon substrate 10, and thus boron introduction layer 61b is formed.

In the third step, a gas obtained by diluting a silicon-containing gas, such as silane ($SiH_4$), with hydrogen is supplied as a material gas into the thin-film deposition chamber. Thus, second intrinsic amorphous silicon layer 61c is formed on boron introduction layer 61b on silicon substrate 10. The third step may be performed under the same condition as the first step, for example.

In the first step and the third step, no mixed gas obtained by diluting a p-type dopant-containing gas, such as diborane ($B_2H_6$), with hydrogen is supplied into the thin-film deposition chamber, for example.

In step S50, a mixed gas obtained by diluting a silicon-containing gas, such as silane ($SiH_4$), and a p-type dopant-containing gas, such as diborane ($B_2H_6$), with hydrogen is supplied as a material gas into the thin-film deposition chamber, and this gas is cracked at the surface of the wire that is disposed in the thin-film deposition chamber and heated through electricity. This cracked gas is supplied onto intrinsic amorphous silicon layer 61 on heated silicon substrate 10, and thus p-type amorphous silicon layer 62 is formed.

In the manufacturing method illustrated in FIG. 6, silicon substrate 10 needs to be flipped only once between step S30 and step S40, and this allows the manufacturing process to be simplified. In addition, in steps S40 and S50 in which diborane ($B_2H_6$) is supplied, intrinsic amorphous silicon layer 31 and n-type amorphous silicon layer 32 have already been formed on the first principal surface of silicon substrate 10. This can keep the gas resulting from the cracked material gas that includes diborane ($B_2H_6$) from going around silicon substrate 10 onto the first principal surface and accumulating on the first principal surface of silicon substrate 10 in steps S40 and S50.

Figure 8:
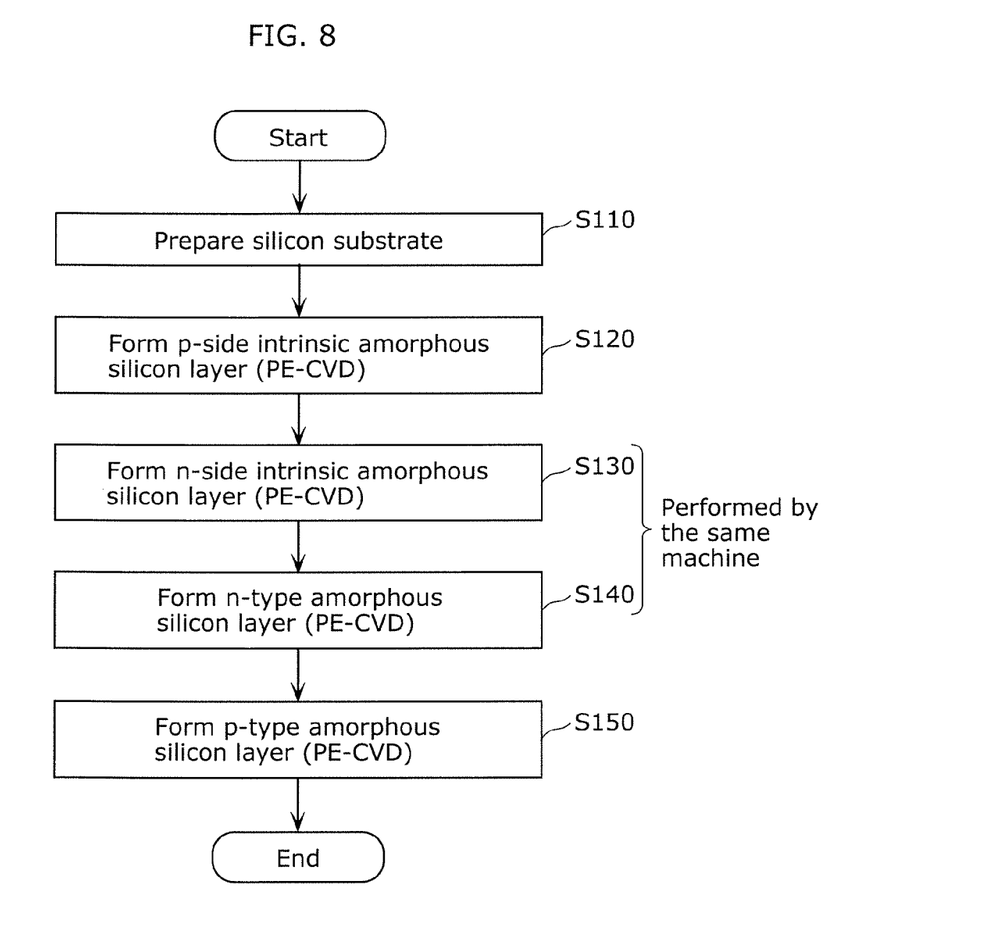
FIG. 8 is a flowchart illustrating another example of a method of manufacturing a solar cell according to an embodiment.
Figure 9:
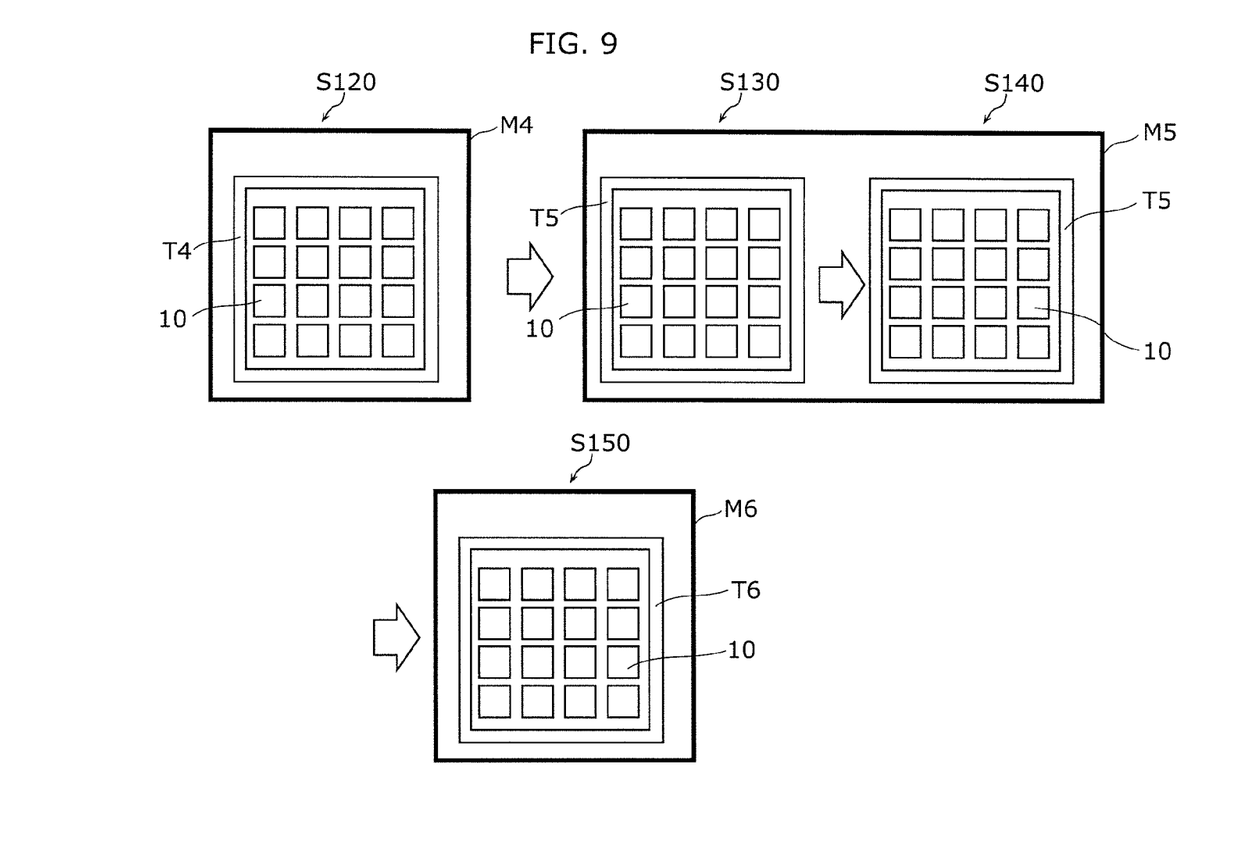
FIG. 9 is a schematic diagram for describing another example of a method of manufacturing a solar cell according to an embodiment.

Now, with reference to FIGS. 8 and 9, another example of the method of manufacturing solar cell 1 described above will be described. FIG. 8 is a flowchart illustrating another example of the method of manufacturing solar cell 1 according to the present embodiment. FIG. 9 is a schematic diagram for describing the other example of the method of manufacturing solar cell 1 according to the present embodiment. In the example described with reference to FIG. 8, each amorphous silicon layer is formed through plasma-enhanced chemical vapor deposition (PE-CVD), from the viewpoint of suppressing interface defect formation and controlling interface oxygen concentration, but this is not a limiting example.

In PE-CVD, a material gas is introduced into a thin-film deposition chamber (vacuum chamber) provided with a plasma source, electric power is supplied to the plasma source from a power source to produce discharge plasma inside the thin-film deposition chamber, the material gas is subjected to cracking reaction with the plasma, and the generated reaction product is deposited on a target (e.g., silicon substrate 10). For PE-CVD, any techniques, such as an RF plasma CVD technique, a high-frequency VHF plasma CVD technique, or a microwave plasma CVD technique, may be used. In the case described below, the RF plasma CVD technique is used.

As illustrated in FIG. 8, first, silicon substrate 10 is prepared (S110). Step S110 is similar to step S10 illustrated in FIG. 6, and thus description thereof will be omitted.

Then, a p-side intrinsic amorphous silicon layer (intrinsic amorphous silicon layer 61) is formed on the second principal surface of silicon substrate 10 where P-doped silicon oxide layer 50 is formed (S120). As illustrated in FIG. 9, in the present embodiment, step S120 is performed with the use of tray T4 and thin-film deposition machine M4. For example, silicon substrate 10 is disposed in tray T4 with the second principal surface (P-doped silicon oxide layer 50) being exposed, and intrinsic amorphous silicon layer 61 is formed on this second principal surface of silicon substrate 10.

In step S120, a mixed gas obtained by diluting a silicon-containing gas, such as silane ($SiH_4$), and a p-type dopant-containing gas, such as diborane ($B_2H_6$), with hydrogen is supplied as a material gas into the thin-film deposition chamber, and this gas is turned into plasma by applying RF-frequency electric power to parallel planar electrodes disposed in the thin-film deposition chamber. This gas in plasma state is supplied onto the second principal surface of silicon substrate 10 heated to no lower than 150° C. nor higher than 250° C., and thus intrinsic amorphous silicon layer 61 is formed. In step S120, a mixed gas obtained by diluting a p-type dopant-containing gas, such as diborane ($B_2H_6$), with hydrogen is supplied intentionally.

In step S120, as in step S40, intrinsic amorphous silicon layer including first intrinsic amorphous silicon layer 61a, boron introduction layer 61b, and second intrinsic amorphous silicon layer 61c is formed. Therefore, diborane ($B_2H_6$) is supplied only for a prescribed period in step S120. Specifically, step S120 includes a first step for forming first intrinsic amorphous silicon layer 61a, a second step for forming boron introduction layer 61b, and a third step for forming second intrinsic amorphous silicon layer 61c. The prescribed period is a period in which the second step for forming boron introduction layer 61b is performed, for example.

Referring back to FIG. 8, next, an n-side intrinsic amorphous silicon layer (intrinsic amorphous silicon layer 31) and n-type amorphous silicon layer 32 are formed on the first principal surface of silicon substrate 10 where no P-doped silicon oxide layer 50 is formed (S130 and S140). As with steps S20 and S30, steps S130 and S140 are performed successively in the same thin-film deposition machine M5. As illustrated in FIG. 9, in the present embodiment, steps S130 and S140 are performed with the use of single tray T5 and single thin-film deposition machine M5.

Furthermore, step S120 and steps S130 and S140 are performed with the use of different trays T4 and T5 and different thin-film deposition machines M4 and M5. Specifically, after intrinsic amorphous silicon layer 61 is formed on silicon substrate 10 by thin-film deposition machine M4, silicon substrate 10 is removed from thin-film deposition machine M4, the tray for thin-film deposition is switched from tray T4 to tray T5, and then intrinsic amorphous silicon layer 31 and n-type amorphous silicon layer 32 are deposited with the use of thin-film deposition machine M5 different from thin-film deposition machine M4. When silicon substrate 10 is moved from tray T4 to tray T5, silicon substrate 10 is disposed in tray T5 so that the first principal surface of silicon substrate 10 is exposed. In other words, silicon substrate 10 is flipped and disposed in tray T5.

In step S130, a gas obtained by diluting a silicon-containing gas, such as silane ($SiH_4$), with hydrogen is supplied as a material gas into the thin-film deposition chamber. In step S140, a mixed gas obtained by diluting a silicon-containing gas, such as silane ($SiH_4$), and an n-type dopant-containing gas, such as phosphine ($PH_3$), with hydrogen is supplied as a material gas into the thin-film deposition chamber.

Referred back to FIG. 8, next, p-type amorphous silicon layer 62 is formed on intrinsic amorphous silicon layer 61 on the photoelectric conversion efficiency, which could be caused by an interposed impurity. Furthermore, the use of PE-CVD in the thin-film deposition method makes it possible to reduce the concentration of oxygen interposed between the layers. For example, the oxygen that is present at the interface between intrinsic amorphous silicon layer 61 and P-doped silicon oxide layer 50 and that has a large influence on the photoelectric conversion efficiency can be reduced, and this leads to improved photoelectric conversion efficiency as compared to the case where CAT-CVD is used. From the viewpoint of improving the photoelectric conversion efficiency effectively, at least intrinsic amorphous silicon layer 61 may be formed through PE-CVD.

An example of fabrication conditions in the method of manufacturing solar cell 1 described above is summarized in Table 1.

TABLE 1

| | | fabrication conditions, etc. | | | |
|---|---|---|---|---|---|
| processing | | substrate temperature (° C.) | used gas | Pressure (Pa) | power (W) |
| light-receiving surface side | hydrogen processing | 170 | $H_2$: 100 sccm | 10 | 200 |
| | intrinsic amorphous silicon layer 31 | 170 | $SiH_4$: 40 sccm $H_2$: 100 sccm | 20 | 150 |
| | n-type amorphous silicon layer 32 | 170 | $SiH_4$: 40 sccm $H_2$: 40 sccm $PH_3$ (2%): 40 sccm | 20 | 150 |
| back surface side | hydrogen processing | 170 | $H_2$: 100 sccm | 10 | 200 |
| | intrinsic amorphous silicon layer 61 | 170 | $SiH_4$: 40 sccm $H_2$: 100-120 sccm $B_2H_6$ (2%): 0-20 sccm | 20 | 150 |
| | p-type amorphous silicon layer 62 | 170 | $SiH_4$: 40 sccm $H_2$: 40 sccm $B_2H_6$ (2%): 20 sccm | 20 | 150 | silicon substrate 10 (S150). As illustrated in FIG. 9, in the present embodiment, step S150 is performed with the use of tray T6 and thin-film deposition machine M6. For example, silicon substrate 10 is disposed in tray T6 with intrinsic amorphous silicon layer 61 being exposed, and p-type amorphous silicon layer 62 is formed on this intrinsic amorphous silicon layer 61 on silicon substrate 10. Specifically, after intrinsic amorphous silicon layer 31 and n-type amorphous silicon layer 32 are formed on silicon substrate 10 by thin-film deposition machine M5, silicon substrate 10 is removed from thin-film deposition machine M5, the tray for thin-film deposition is switched from tray T5 to tray T6, and then intrinsic p-type amorphous silicon layer 62 is deposited with the use of thin-film deposition machine M6 different from thin-film deposition machines M4 and M5. When silicon substrate 10 is moved from tray T5 to tray T6, silicon substrate 10 is disposed in tray T6 so that intrinsic amorphous silicon layer 61 on silicon substrate 10 is exposed. In other words, silicon substrate 10 is flipped and disposed in tray T6.

In step S150, a mixed gas obtained by diluting a silicon-containing gas, such as silane ($SiH_4$), and a p-type dopant-containing gas, such as diborane ($B_2H_6$), with hydrogen is supplied as a material gas into the thin-film deposition chamber.

In the manufacturing method illustrated in FIG. 8, first, intrinsic amorphous silicon layer 61 can be formed on silicon substrate 10. This makes it possible to keep an impurity from being interposed between intrinsic amorphous silicon layer 61 and P-doped silicon oxide layer 50, which in turn makes it possible to suppress any decrease in As described above, the method of manufacturing solar cell 1 includes a step of forming amorphous silicon layer 30, a step of forming intrinsic amorphous silicon layer 61, and a step of forming p-type amorphous silicon layer 62. The three steps are performed with the use of different thin-film deposition machines and different trays. In the step of forming intrinsic amorphous silicon layer 61, the supply amount by which a mixed gas obtained by diluting a p-type dopant-containing gas, such as diborane ($B_2H_6$), with hydrogen is supplied to the thin-film deposition chamber is varied. Specifically, the step of forming intrinsic amorphous silicon layer 61 includes a first step of forming first intrinsic amorphous silicon layer 61a without the mixed gas being supplied, a second step of forming boron introduction layer 61b with the mixed gas being supplied, and a third step of forming second intrinsic amorphous silicon layer 61c without the mixed gas being supplied.

4. Advantageous Effects and Others

As described above, solar cell 1 according to the present embodiment includes crystalline silicon substrate 10, P-doped silicon oxide layer 50 (an example of a phosphorus-doped layer), and amorphous silicon layer 60. P-doped silicon oxide layer 50 is formed on the second principal surface of silicon substrate 10 and includes phosphorus as an impurity. Amorphous silicon layer 60 includes intrinsic amorphous silicon layer 61 formed on P-doped silicon oxide layer 50 and p-type amorphous silicon layer 62 that is formed on intrinsic amorphous silicon layer 61 and that includes boron (an example of a p-type dopant). Furthermore, intrinsic amorphous silicon layer 61 includes boron, and the concentration of boron in the thickness direction of intrinsic amorphous silicon layer 61 has a profile higher than the concentration of boron at the interface between P-doped silicon oxide layer 50 and intrinsic amorphous silicon layer 61.

In an existing solar cell, in heterojunction of a crystalline silicon substrate and an amorphous silicon layer, for example, recombination of carriers at the junction interface can be suppressed by providing a passivation layer (e.g., a substantially intrinsic silicon layer) on the principal surface of the silicon substrate, and thus an open-circuit voltage can be improved. However, even when a passivation layer is provided, because of a defect or the like in the front surface of the silicon substrate, recombination of carriers in the amorphous silicon layer cannot be suppressed completely due to the defect. Furthermore, if the concentration of an impurity (e.g., phosphorus) in the silicon substrate is increased to further improve the photoelectric conversion performance, the electric-field strength of the amorphous silicon layer is reduced, and this leads to increased recombination of carriers in the amorphous silicon layer. In other words, recombination of carriers in the amorphous silicon layer cannot be suppressed completely by only the impurity present at the front surface of the silicon substrate. Furthermore, an excessive impurity concentration at the front surface of the silicon substrate leads to increased defects at the front surface of the silicon substrate, and the photoelectric conversion performance decreases in turn.

In contrast, in solar cell 1 according to the present embodiment, P-doped silicon oxide layer 50 is interposed between amorphous silicon layer 60 and silicon substrate 10, and this P-doped silicon oxide layer 50 is doped with phosphorus. Since P-doped silicon oxide layer 50 is interposed, instead of interposing an impurity at the junction interface, an increase in defect in the front surface of silicon substrate 10 can be suppressed. This makes it possible to improve the open-circuit voltage.

Furthermore, in solar cell 1 according to the present embodiment, intrinsic amorphous silicon layer 61 includes boron, and in the concentration profile of this boron, the concentration in intrinsic amorphous silicon layer 61 is higher than the concentration at the interface between intrinsic amorphous silicon layer 61 and silicon substrate 10. In other words, the boron concentration at the interface between intrinsic amorphous silicon layer 61 and silicon substrate 10 is lower than the boron concentration in intrinsic amorphous silicon layer 61. When both phosphorus and boron are present at the interface between intrinsic amorphous silicon layer 61 and silicon substrate 10, recombination of carriers occurs more easily. However, since the concentration of boron at the interface is low in solar cell 1 according to the present embodiment, recombination of carriers caused by the presence of both phosphorus and boron can be suppressed. This makes it possible to improve the open-circuit voltage. Furthermore, the increase in the boron concentration in intrinsic amorphous silicon layer 61 with respect to the boron concentration at the interface makes it possible to reduce the series resistance component caused by intrinsic amorphous silicon layer 61. Thus, a high fill factor (FF) can be obtained.

In other words, with solar cell 1 according to the present embodiment, as P-doped silicon oxide layer 50 that includes phosphorus as an impurity is interposed between amorphous silicon layer 60 and silicon substrate 10, and as the boron concentration at the interface is lower than the boron concentration in intrinsic amorphous silicon layer 61, recombination of carriers at the interface can be suppressed. Furthermore, the increase in the boron concentration in intrinsic amorphous silicon layer 61 with respect to the boron concentration at the interface makes it possible to reduce the series resistance component caused by intrinsic amorphous silicon layer 61. Accordingly, solar cell 1 according to the present embodiment can provide improved photoelectric conversion performance. It is to be noted that solar cell 1 has a heterojunction structure.

The boron concentration profile may have a local maximum within a range of no less than 20% nor more than 50% of the thickness of amorphous silicon layer 60 from the interface. Furthermore, the boron concentration profile may have a local maximum within a range of no less than 2 nm nor more than 10 nm from the interface.

Then, as compared to the case where a local maximum in the boron concentration profile is present in the vicinity of the interface between intrinsic amorphous silicon layer 61 and silicon substrate 10, recombination of carriers at the interface between intrinsic amorphous silicon layer 61 and silicon substrate 10 can be suppressed without increasing the series resistance component caused by intrinsic amorphous silicon layer 61. Accordingly, with solar cell 1, the photoelectric conversion performance can be further improved, as compared to the case where a local maximum in the boron concentration profile is present in the vicinity of the interface between intrinsic amorphous silicon layer 61 and silicon substrate 10.

The boron concentration at a local maximum is no less than $1\times10^{17}/cm^3$ nor more than $1\times10^{20}/cm^3$.

This makes it possible to achieve both a high fill factor and a high open-circuit voltage, and thus the photoelectric conversion efficiency of solar cell 1 can be further improved.

As described above, solar cell module 100 according to the present embodiment includes a plurality of solar cells 1 disposed two-dimensionally, front surface protector 180A disposed on the front surface side of the plurality of solar cells 1, back surface protector 180B disposed on the back surface side of the plurality of solar cells 1, front surface encapsulant 170A disposed between the plurality of solar cells 1 and front surface protector 180A, and back surface encapsulant 170B disposed between the plurality of solar cells 1 and back surface protector 180B.

This makes it possible to suppress recombination of carriers at the semiconductor junction interface between crystalline silicon substrate 10 and amorphous silicon layer 60 and to reduce the series resistance component of intrinsic amorphous silicon layer 61. Accordingly, the open-circuit voltage and the fill factor of solar cell 1 can be improved, and thus the power generation efficiency of solar cell module 100 can be improved.

Variation of Embodiment

Figure 10:
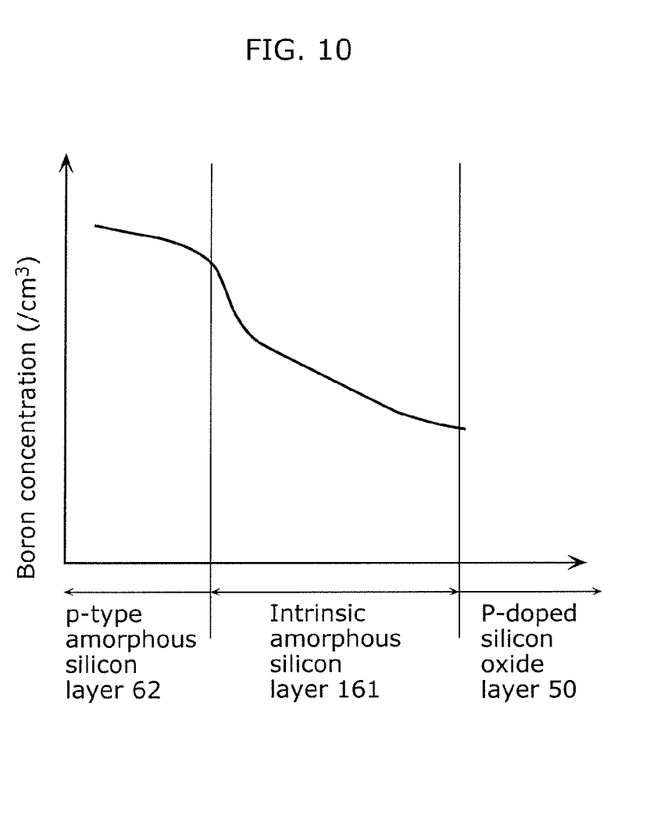
FIG. 10 is a graph illustrating another example of a boron concentration profile with respect to the thickness direction of an intrinsic amorphous silicon layer.

A solar cell according to the present variation will be described with reference to FIG. 10. The solar cell according to the present variation includes intrinsic amorphous silicon layer 161, in place of intrinsic amorphous silicon layer 61 according to the embodiment. Intrinsic amorphous silicon layer 161 differs from intrinsic amorphous silicon layer 61 according to the embodiment in terms of the boron concentration profile, and the following description centers on this point. FIG. 10 is a graph illustrating another example of the boron concentration profile with respect to the thickness direction of intrinsic amorphous silicon layer 161.

As illustrated in FIG. 10, the boron concentration profile of intrinsic amorphous silicon layer 161 has a slope that monotonically increases from the interface with P-doped silicon oxide layer 50 toward p-type amorphous silicon layer 62. A monotonical increase means that the boron concentration never decreases toward p-type amorphous silicon layer 62 in the thickness direction of intrinsic amorphous silicon layer 161. As illustrated in FIG. 10, a monotonical increase includes, in addition to the case where the boron concentration increases continuously, the case where the boron concentration increases stepwise, for example. The concentration profile has no local maximum.

The boron concentration in intrinsic amorphous silicon layer 161 is lower than the boron concentration in p-type amorphous silicon layer 62. The boron concentration in intrinsic amorphous silicon layer 161 monotonically increases between the boron concentration at the interface with P-doped silicon oxide layer 50 and the boron concentration in p-type amorphous silicon layer 62.

Intrinsic amorphous silicon layer 161 can be formed by increasing stepwise the amount by which the mixed gas obtained by diluting a p-type dopant-containing gas, such as diborane ($B_2H_6$), with hydrogen is supplied to the thin-film deposition chamber in step S40 illustrated in FIG. 6 or in step S120 illustrated in FIG. 8.

As described above, the boron concentration profile in the thickness direction of intrinsic amorphous silicon layer 161 in the solar cell according to the present variation monotonically increases from the interface between P-doped silicon oxide layer 50 and intrinsic amorphous silicon layer 161 toward p-type amorphous silicon layer 62.

Thus, as compared to the case where a local maximum in the boron concentration profile is present in the vicinity of the interface between intrinsic amorphous silicon layer 161 and silicon substrate 10, recombination of carriers at the interface between intrinsic amorphous silicon layer 161 and silicon substrate 10 can be suppressed without increasing the series resistance component caused by intrinsic amorphous silicon layer 161. Accordingly, with this solar cell, the photoelectric conversion performance can be further improved, as compared to the case where a local maximum in the boron concentration profile is present in the vicinity of the interface between intrinsic amorphous silicon layer 161 and silicon substrate 10.

OTHER EMBODIMENTS

Thus far, the solar cell and the solar cell module according to an aspect of the present invention have been described based on the foregoing embodiment and the variation thereof, but the present invention is not limited to the foregoing embodiment.

For example, although a configuration in which a plurality of solar cells are disposed in a matrix in a plane is illustrated for the solar cell module according to the foregoing embodiment, the arrangement of the solar cells is not limited to a matrix. For example, the solar cells may be disposed annularly or disposed along a one-dimensional straight line or a curved line.

In the example described in the foregoing embodiment, an n-type semiconductor layer is formed on the light-receiving surface side of the solar cell, but this is not a limiting example. A p-type semiconductor layer may be formed on the light-receiving surface side of the solar cell.

In the example described in the foregoing embodiment and the variation thereof, an intrinsic amorphous silicon layer has a three-layer structure of a first intrinsic amorphous silicon layer, a boron introduction layer, and a second intrinsic amorphous silicon layer, but this is not a limiting example. The intrinsic amorphous silicon layer does not need to include at least one of the first intrinsic amorphous silicon layer or the second intrinsic amorphous silicon layer.

In the example described in the foregoing embodiment and the variation thereof, the boron concentration profile of the intrinsic amorphous silicon layer has one local maximum, but this is not a limiting example. The boron concentration profile of the intrinsic amorphous silicon layer may have two or more local maximums.

In the example described with reference to FIGS. 5 and 10 in the foregoing embodiment and the variation thereof, the boron concentration profile of the intrinsic amorphous silicon layer is higher than the boron concentration at the interface between the intrinsic amorphous silicon layer and the P-doped silicon oxide layer through the entire region in the thickness direction of the intrinsic amorphous silicon layer, but this is not a limiting example. The boron concentration profile of the intrinsic amorphous silicon layer may have a portion in the thickness direction of the intrinsic amorphous silicon layer where the boron concentration of the intrinsic amorphous silicon layer is lower than the boron concentration at the interface.

In the method described in the foregoing embodiment and the variation thereof, the solar cell is manufactured with the use of trays, but this is not a limiting example. In manufacturing the solar cell, at least one amorphous silicon layer may be formed without the use of a tray, for example. In this case, a p-type amorphous silicon layer and a p-side amorphous silicon layer are deposited by different thin-film deposition machines. The absence of trays makes it possible to reduce the amount of oxygen introduced into the thin-film deposition machines. Thus, for example, the oxygen concentration at the interface between the P-doped silicon oxide layer and the p-side intrinsic amorphous silicon layer, which has a large influence on the photoelectric conversion efficiency, can be reduced.

In the example described in the foregoing embodiment and the variation thereof, the P-doped silicon oxide layer is formed on the second principal surface of the silicon substrate, but the P-doped silicon oxide layer may be formed also on the first principal surface of the silicon substrate.

The order of the steps in the method of manufacturing the solar cell described in the foregoing embodiment and the variation thereof is an example, and this is not a limiting example. The order of the steps may be changed, or one or more of the steps may be omitted.

The method of manufacturing the solar cell described in the foregoing embodiment and the variation thereof is not limited to those illustrated in FIGS. 6 and 8 described above. For example, in FIG. 6, at least one step of steps S20 to S50 may be performed with the use of PE-CVD. In addition, for example, in FIG. 8, at least one step of steps S120 to S150 may be performed with the use of CAT-CVD. In other words, the solar cell may be manufactured through a combination of different thin-film deposition methods. Furthermore, each semiconductor layer may be formed through a thin-film deposition method other than CAT-CVD or PE-CVD. For example, at least one of the semiconductor layers may be formed through a sputtering technique or the like.

The steps in the method of manufacturing the solar cell described in the foregoing embodiment and the variation thereof may be performed in a single step or in separate steps. That the steps are performed in a single step may encompass that the steps are performed with the use of a single machine, that the steps are performed successively, or that the steps are performed at the same location. That the steps are performed in separate steps may encompass that the steps are performed with the use of separate machines, that the steps are performed at different times (e.g., on different days), or that the steps are performed at different locations.

Aside from the above, an embodiment obtained by making various modifications that a person skilled in the art can conceive of to the foregoing embodiments and an embodiment achieved by combining, as desired, the constituent elements and the functions in the embodiments and the variation thereof within the scope that does not depart from the spirit of the present invention are also encompassed by the present invention.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

The invention claimed is:

1. A solar cell, comprising:
a crystalline silicon substrate;
a phosphorus-doped layer formed on a principal surface of the crystalline silicon substrate, the phosphorus-doped layer including phosphorus as an impurity; and
an amorphous silicon layer including an intrinsic amorphous silicon layer and a p-type amorphous silicon layer, the intrinsic amorphous silicon layer being formed on the phosphorus-doped layer, the p-type amorphous silicon layer being formed on the intrinsic amorphous silicon layer and including a p-type dopant, wherein
the intrinsic amorphous silicon layer includes the p-type dopant,
a concentration of the p-type dopant in a concentration profile in a thickness direction of the intrinsic amorphous silicon layer is higher than a concentration of the p-type dopant at an interface between the phosphorus-doped layer and the intrinsic amorphous silicon layer, and
the intrinsic amorphous silicon layer includes: a first intrinsic amorphous silicon layer disposed to face the phosphorus-doped layer; a second intrinsic amorphous silicon layer disposed to face the p-type amorphous silicon layer; and an introduction layer disposed between the first intrinsic amorphous silicon layer and the second intrinsic amorphous silicon layer, the introduction layer containing the p-type dopant.

2. The solar cell according to claim 1, wherein the concentration profile has a local maximum within a range of no less than 20% nor more than 50% of a thickness of the amorphous silicon layer from the interface.

3. The solar cell according to claim 2, wherein the concentration of the p-type dopant at the local maximum is no less than $1\times10^{17}/cm^3$ nor more than $1\times10^{20}/cm^3$.

4. The solar cell according to claim 1, wherein the concentration profile has a local maximum within a range of no less than 2 nm nor more than 10 nm from the interface.

5. The solar cell according to claim 1, wherein the concentration profile monotonically increases from the interface toward the p-type amorphous silicon layer.

6. A solar cell module, comprising:
a plurality of solar cells each of which is the solar cell according to claim 1, the plurality of solar cells being disposed two-dimensionally;
a front surface protector disposed on a front surface side of the plurality of solar cells;
a back surface protector disposed on a back surface side of the plurality of solar cells;
a front surface encapsulant disposed between the plurality of solar cells and the front surface protector; and
a back surface encapsulant disposed between the plurality of solar cells and the back surface protector.

7. The solar cell according to claim 1, wherein the first intrinsic amorphous silicon layer has a thickness less than each of a thickness of the introduction layer and a thickness of the second intrinsic amorphous silicon layer.

8. The solar cell according to claim 1, wherein the introduction layer and the second intrinsic amorphous silicon layer are equivalent to each other in thickness.

9. The solar cell according to claim 1, wherein the intrinsic amorphous silicon layer has a local maximum of the concentration of the p-type dopant in the concentration profile, in the introduction layer among the first intrinsic amorphous silicon layer, the introduction layer, and the second intrinsic amorphous silicon layer.

10. The solar cell according to claim 1, wherein
the phosphorus-doped layer includes oxygen, and
a local maximum of the concentration of the p-type dopant in the concentration profile in the intrinsic amorphous silicon layer and a local maximum of an oxygen concentration of the phosphorus-doped layer are present at positions different from each other in the thickness direction.

11. The solar cell according to claim 10, wherein the local maximum of the concentration of the p-type dopant in the concentration profile is present closer to the p-type amorphous silicon layer than the local maximum of the oxygen concentration in the thickness direction.

12. The solar cell according to claim 11, wherein a gap between the local maximum of the concentration of the p-type dopant in the concentration profile and the local maximum of the oxygen concentration is no less than 2 nm in the thickness direction.

13. The solar cell according to claim 10, wherein the concentration profile of the p-type dopant and a concentration profile of the oxygen concentration are intersect with each other in the thickness direction.

* * * * *